(12) United States Patent
Yantchev et al.

(10) Patent No.: US 11,742,828 B2
(45) Date of Patent: Aug. 29, 2023

(54) TRANSVERSELY-EXCITED FILM BULK ACOUSTIC RESONATOR WITH SYMMETRIC DIAPHRAGM

(71) Applicant: Murata Manufacturing Co., Ltd., Nagaokakyo (JP)

(72) Inventors: Ventsislav Yantchev, Sofia (BG); Sho Nagatomo, Nagaokakyo (JP); Kazunori Inoue, Nagaokakyo (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 211 days.

(21) Appl. No.: 17/132,834

(22) Filed: Dec. 23, 2020

(65) Prior Publication Data

US 2021/0409001 A1 Dec. 30, 2021

Related U.S. Application Data

(60) Provisional application No. 63/045,916, filed on Jun. 30, 2020.

(51) Int. Cl.
| | |
|---|---|
| *H03H 9/205* | (2006.01) |
| *H03H 9/02* | (2006.01) |
| *H03H 9/54* | (2006.01) |

(52) U.S. Cl.
CPC ........ *H03H 9/205* (2013.01); *H03H 9/02015* (2013.01); *H03H 9/02157* (2013.01); *H03H 9/02228* (2013.01); *H03H 9/54* (2013.01)

(58) Field of Classification Search
CPC ............... H03H 9/205; H03H 9/02015; H03H 9/02157; H03H 9/0228; H03H 9/54
See application file for complete search history.

(56) References Cited

U.S. PATENT DOCUMENTS

| | | | |
|---|---|---|---|
| 5,853,601 A | 12/1998 | Krishaswamy et al. | |
| 6,540,827 B1 | 4/2003 | Levy et al. | |

(Continued)

FOREIGN PATENT DOCUMENTS

| | | |
|---|---|---|
| JP | 2004-96677 A | 10/2005 |
| JP | 2013-214954 A | 10/2013 |

(Continued)

OTHER PUBLICATIONS

T. Takai, H. Iwamoto, et al., "I.H.P. Saw Technology and its Application to Microacoustic Components (Invited)." 2017 IEEE International Ultrasonics Symposium, Sep. 6-9, 2017. pp. 1-8.

(Continued)

*Primary Examiner* — Lincoln D Donovan
*Assistant Examiner* — Alex W Lam
(74) *Attorney, Agent, or Firm* — ArentFox Schiff LLP (57) ABSTRACT

Acoustic resonator devices and filters are disclosed. An acoustic resonator includes a substrate having a surface. A back surface of a single-crystal piezoelectric plate is attached to the surface of the substrate except for a portion of the piezoelectric plate forming a diaphragm spanning a cavity in the substrate. An interdigital transducer (IDT) is formed on a front surface of the piezoelectric plate with interleaved IDT fingers of the IDT disposed on the diaphragm. Back-side fingers are formed the back surface of the diaphragm. A pitch of the IDT fingers and a pitch of the back-side fingers are substantially equal.

21 Claims, 11 Drawing Sheets

(56) References Cited

U.S. PATENT DOCUMENTS

| | | |
|---|---|---|
| 6,707,229 B1 | 3/2004 | Martin |
| 7,042,132 B2 | 5/2006 | Bauer et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,240,768 B2 | 1/2016 | Sakashita et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 2002/3007998 | 6/2002 | Ruby et al. |
| 2002/0158714 A1 | 10/2002 | Kaitila et al. |
| 2003/0199105 A1 | 10/2003 | Kub et al. |
| 2004/0261250 A1 | 12/2004 | Kadota et al. |
| 2007/0194863 A1 | 8/2007 | Shibata et al. |
| 2010/0064492 A1 | 3/2010 | Tanaka |
| 2010/0123367 A1 | 5/2010 | Tai et al. |
| 2011/0109196 A1 | 5/2011 | Goto |
| 2011/0278993 A1 | 11/2011 | Iwamoto |
| 2013/0234805 A1 | 9/2013 | Takahashi |
| 2013/0321100 A1 | 12/2013 | Wang |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214387 A1 | 7/2017 | Burak et al. |
| 2017/0222622 A1 | 8/2017 | Solal et al. |
| 2017/0370791 A1 | 12/2017 | Nakamura et al. |
| 2018/0123016 A1 | 5/2018 | Gong et al. |
| 2018/0191322 A1 | 7/2018 | Chang et al. |
| 2019/0068164 A1 | 2/2019 | Houlden et al. |
| 2019/0131953 A1 | 5/2019 | Gong |
| 2019/0273480 A1 | 9/2019 | Lin |

FOREIGN PATENT DOCUMENTS

| | | | |
|---|---|---|---|
| JP | 2018-93487 A | | 11/2017 |
| WO | 2016017104 | | 2/2016 |
| WO | WO2016052129 | * | 4/2016 |
| WO | WO2016/052129 | | 7/2016 |
| WO | 2018003273 A1 | | 1/2018 |
| WO | WO2019/138810 | | 7/2019 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

Acoustic Properties of Solids ONDA Corporation 592 Weddell Drive, Sunnyvale, CA 94089, Apr. 11, 2003, pp. 5 (Year 2003).

Bahreynl, B. Fabrication and Design of Resonant Microdevices Andrew William, Inc. 2018, NY (Year 2008).

Material Properties of Tibtech Innovations, © 2018 Tibtech Innovations (Year 2018).

German Office Action dated Jan. 30, 2023 for German Applicaton No. 112020004113.1.

\* cited by examiner

TRANSVERSELY-EXCITED FILM BULK ACOUSTIC RESONATOR WITH SYMMETRIC DIAPHRAGM

RELATED APPLICATION INFORMATION

This patent claims priority from provisional patent application 63/045,916, filed Jun. 30, 2020, entitled SYMMETRIC XBAR TOPOLOGIES FOR SPUR CONTROL.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
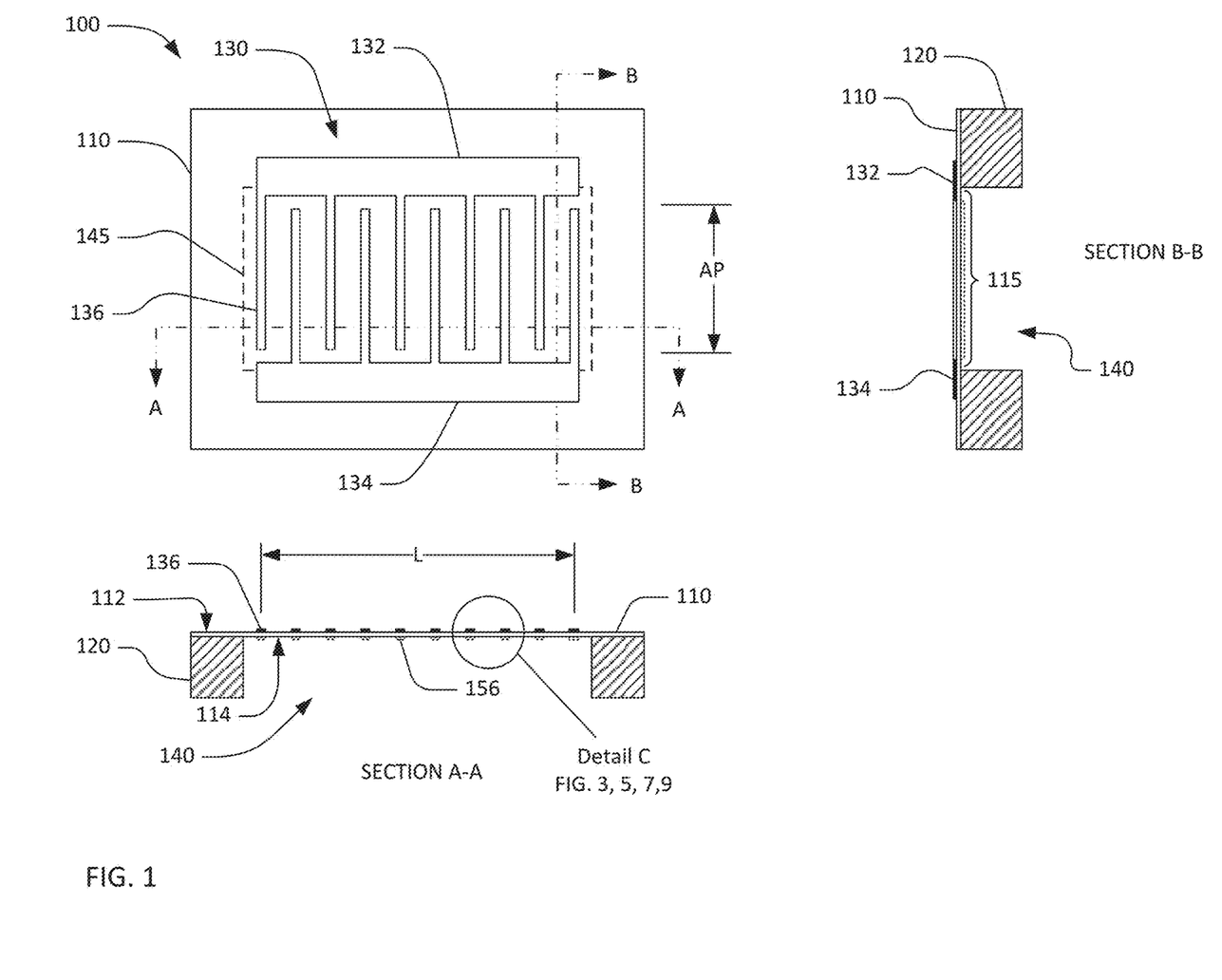
FIG. 1 has a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are rotated Y-X cut. However, XBARs may be fabricated on piezoelectric plates with other crystallographic orientations including Z-cut and rotated Z-cut.

The back surface 114 of the piezoelectric plate 110 is attached to a surface of a substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 2). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the interleaved portions of the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

As will be discusses subsequently, an XBAR may have fingers, such as finger 156, or other structures formed on the back surface 114 of the diaphragm 115 to make the diaphragm more symmetrical by balancing, at least in part, the mass of the IDT fingers.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 130. An XBAR may have hundreds, possibly thousands, of parallel fingers in the IDT 130. Similarly, the thickness of the fingers in the cross-sectional views is greatly exaggerated in the drawings.

Figure 2:
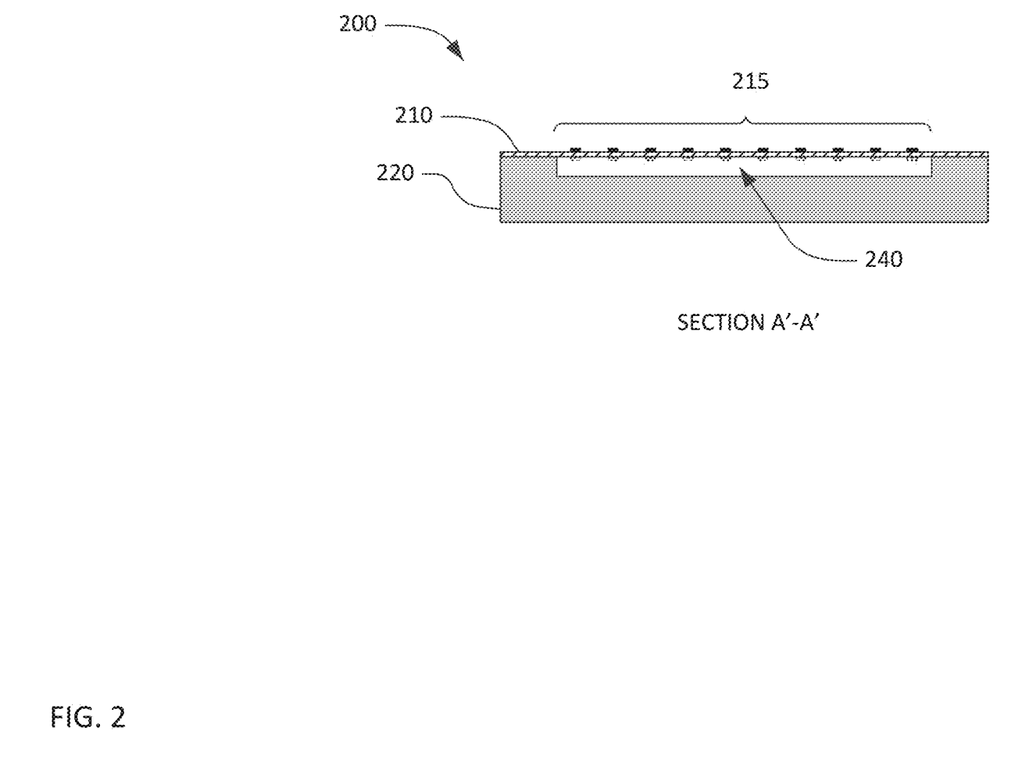
FIG. 2 is an alternative schematic cross-sectional view of the XBAR of FIG. 1.

FIG. 2 is an alternative cross-sectional view along the section plane A-A defined in FIG. 1. In FIG. 2, a piezoelectric plate 210 is attached to a substrate 220. A portion of the piezoelectric plate 210 forms a diaphragm 215 spanning a cavity 240 in the substrate. The cavity 240 does not fully penetrate the substrate 220. Fingers of an IDT are disposed on the diaphragm 215. The cavity 240 may be formed, for example, by etching the substrate 220 before attaching the piezoelectric plate 210. Alternatively, the cavity 240 may be formed by etching the substrate 220 with a selective etchant that reaches the substrate through one or more openings (not shown) provided in the piezoelectric plate 210. In this case, the diaphragm 215 may be contiguous with the rest of the piezoelectric plate 210 around a large portion of a perimeter 245 of the cavity 240. For example, the diaphragm 215 may be contiguous with the rest of the piezoelectric plate 210 around at least 50% of the perimeter 245 of the cavity 240.

Figure 3:
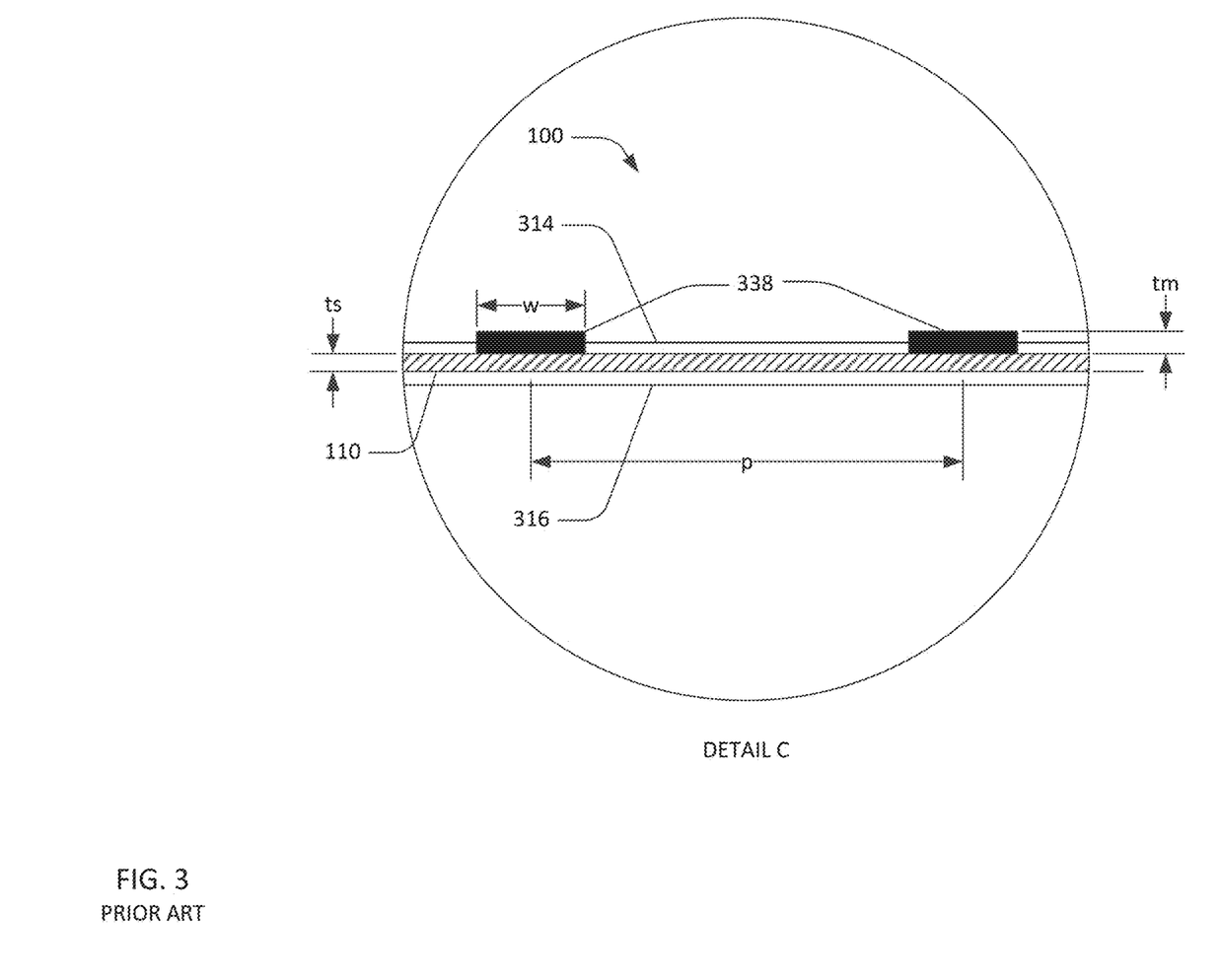
FIG. 3 is an expanded schematic cross-sectional view of a portion of the XBAR of FIG. 1.

FIG. 3 shows an expanded schematic cross-sectional view of the XBAR 100 at a location "Detail C" identified in FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

The IDT fingers 338 may be one or more layers of aluminum, copper, beryllium, gold, molybdenum, chrome, tungsten, titanium, some other conductive material, and alloys and combination thereof. And IDT finger is considered as "substantially" one metal (such as aluminum or copper) if that metal constitutes at least 80% of the finger by weight. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 3, the IDT fingers 338 have rectangular cross-sections. The IDT fingers may have some other cross-sectional shape, such as trapezoidal.

A front-side dielectric layer 314 may be formed on the front side of the piezoelectric plate 110. The "front side" of the XBAR is the surface facing away from the substrate. As shown in FIG. 3, the front-side dielectric layer 314 is formed between the IDT fingers 338. Although not shown in FIG. 3, the front side dielectric layer 314 may also be deposited over the IDT fingers 338. A back-side dielectric layer 316 may be formed on the back side of the piezoelectric plate 110. The front-side and back-side dielectric layers 314, 316 may be a non-piezoelectric dielectric material, such as silicon dioxide or silicon nitride. The thicknesses of the front-side and back-side dielectric layers 314, 316 are typically less than 50% of the thickness ts of the piezoelectric plate. The thicknesses of the front-side and back-side dielectric layers 314, 316 are not necessarily equal, and the front-side and back-side dielectric layers 314, 316 are not necessarily the same material. Either or both of the front-side and back-side dielectric layers 314, 316 may be formed of multiple layers of two or more materials.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs signifcnatly from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 4:
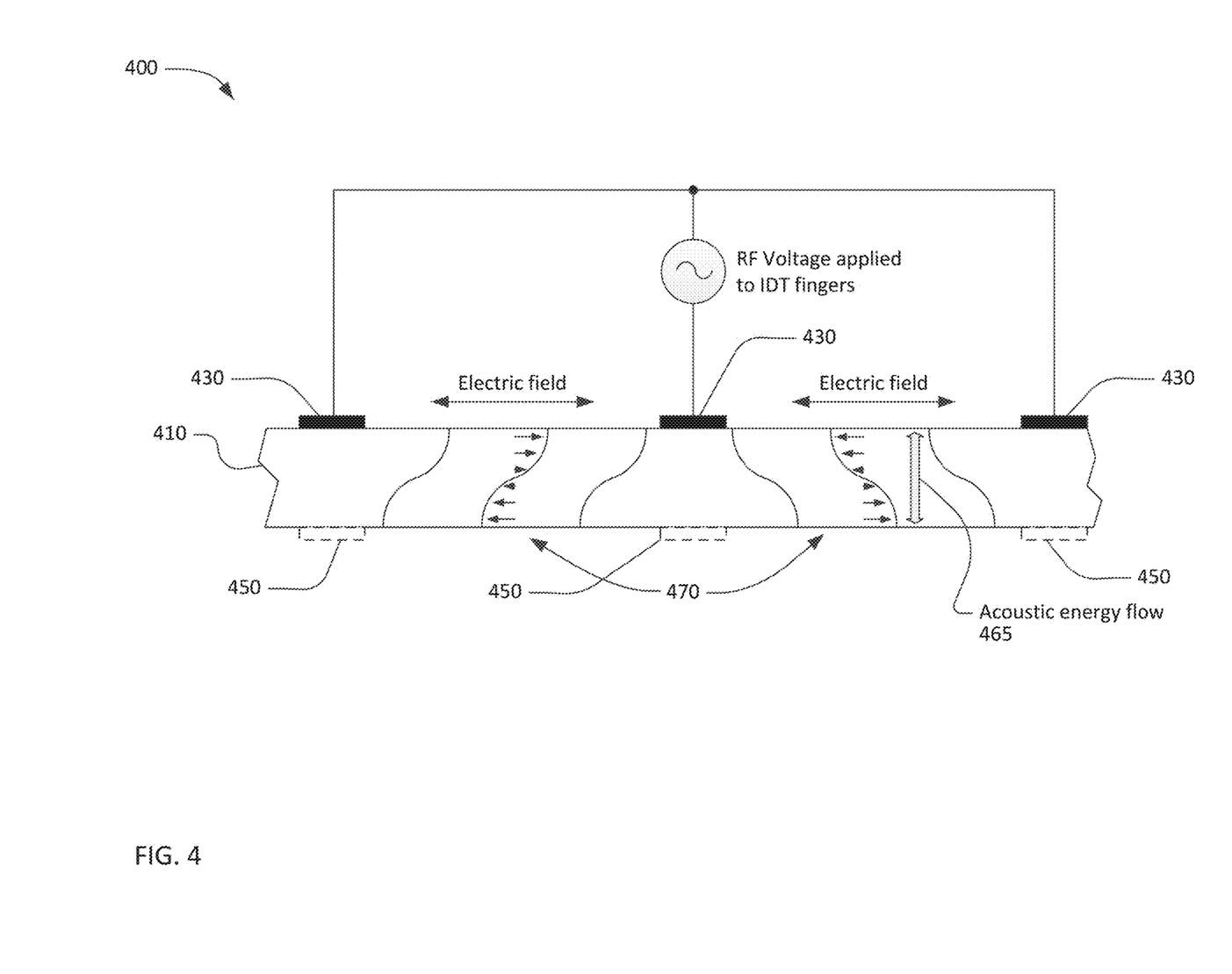
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

As previously described, the primary acoustic mode in an XBAR is a shear mode. However other modes may also be excited. To avoid unacceptable distortions in the performance of a filter, such spurious modes must be controlled by either reducing the magnitude of the spurious mode to a negligible level and/or moving the spurious mode to a frequency where the spurious mode does not have a negative impact on filter performance.

Spurious modes in XBARs often originate from the lowest order antisymmetric Lamb wave (AO) and its specific interaction with the primary shear mode in the presence of the IDT fingers. The asymmetric structure of a conventional XBAR, with IDT fingers (and typically dielectric layers) on only one side of the piezoelectric diaphragm, facilitates excitation of spurious modes. Spurious modes can be controlled, to some extent, by proper selection of the IDT pitch and mark. This method provides control over some selected spurs near the passband but not the out-of-band spurs, where their presence affects the ability to satisfy stop-band rejection specifications.

A symmetric diaphragm structure has a potential to significantly reduce the spur content over a wide frequency band. To this end, an XBAR may have structures, such as fingers 450 on the back side of the piezoelectric plate 410 to balance, at least in part, the mass of the IDT fingers 430.

Figure 5:
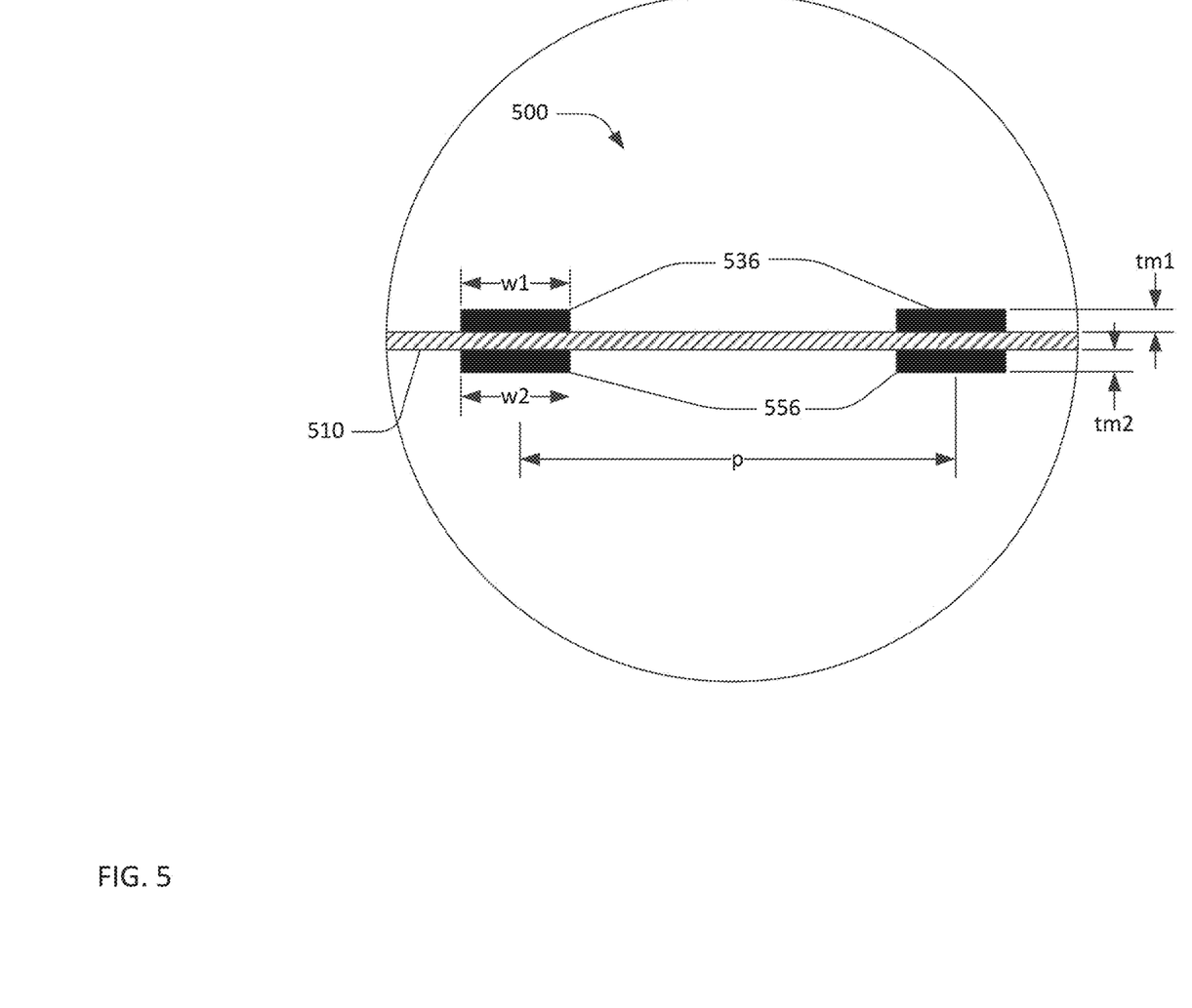
FIG. 5 is an expanded schematic cross-sectional view of a portion of the XBAR of FIG. 1 with a symmetrical diaphragm.

FIG. 5 shows an expanded schematic cross-sectional view of an XBAR 500 which may be the XBAR 100 of FIG. 1. The XBAR 500 has a symmetric diaphragm in that the IDT fingers 536 on the front surface of the piezoelectric plate 510 are balanced, to at least some extent, by back-side fingers 556 on the back surface of the piezoelectric plate. Ideally, the mass per unit length of each IDT finger is equal to the mass, per unit length, of the corresponding back-side finger. An exact mass balance is not necessarily required. The mas per unit length f the IDT fingers and the back-side fingers are considered "effectively equal" if the presence of the back-side fingers results in a significant reduction in the number and/or amplitude of spurious modes within a frequency range of interest.

The piezoelectric plate 510 is a single-crystal layer of piezoelectrical material. IDT fingers 536 are formed on the top surface of the piezoelectric plate as previously described. The IDT fingers may be composed of one or more layers of metals and may have some other cross-sectional shape, such as trapezoidal. Back-side fingers 556 are formed on the back surface of the piezoelectric plate 510. The back-side fingers 556 may also be composed of one or more layers of metals and may have some other cross-sectional shape, such as trapezoidal. The composition and cross-sectional shape of the back-side fingers 556 may be the same or different from the composition and cross-sectional shape of the IDT fingers 536.

Each back-side finger 556 may be substantially aligned with a corresponding IDT finger 536. An IDT finger and the corresponding back-side finger are considered perfectly aligned if a line perpendicular to the surfaces of the piezoelectric plate and passing through a center of the width of the IDT finger also passes through a center of the width of the back-side finger. An IDT finger and the corresponding back-side finger are considered "substantially" aligned if a line perpendicular to the surfaces of the piezoelectric plate and passing through the center of the width of the IDT finger passes within a predetermined manufacturing tolerance of the center of the width of the back-side finger.

Each back-side finger 556 may extend across the aperture of the XBAR 500. The back-side fingers 556 may connect alternately to back-side busbars to form an IDT on the back surface of the piezoelectric plate. The back-side busbars may be electrically connected to the busbars of the IDT (130 in FIG. 1) on the front surface of the piezoelectric plate. In this case, each back-side finger 556 is electrically connected to the corresponding IDT finger 536.

The dimension p is the pitch of the fingers, which may be substantially equal for both the IDT fingers 536 and the back-side fingers 556. I this and similar contexts, "substantially equal" means equal within normal manufacturing tolerances. The width and thickness of the IDT fingers are the dimensions w1 and tm1, respectively. The width and thickness of the back-side fingers are the dimensions w2 and tm2, respectively. When the composition and cross-sectional shapes of the back-side fingers 556 and the IDT fingers 536 are the same, w1 may be equal to w2 and tm1 may be equal to tm2. When the composition and/or cross-sectional shapes of the back-side fingers 556 and the IDT fingers 536 are the different, one or both of w2 and tm2 may be adjusted to minimize excitation of spurious modes.

Figure 6:
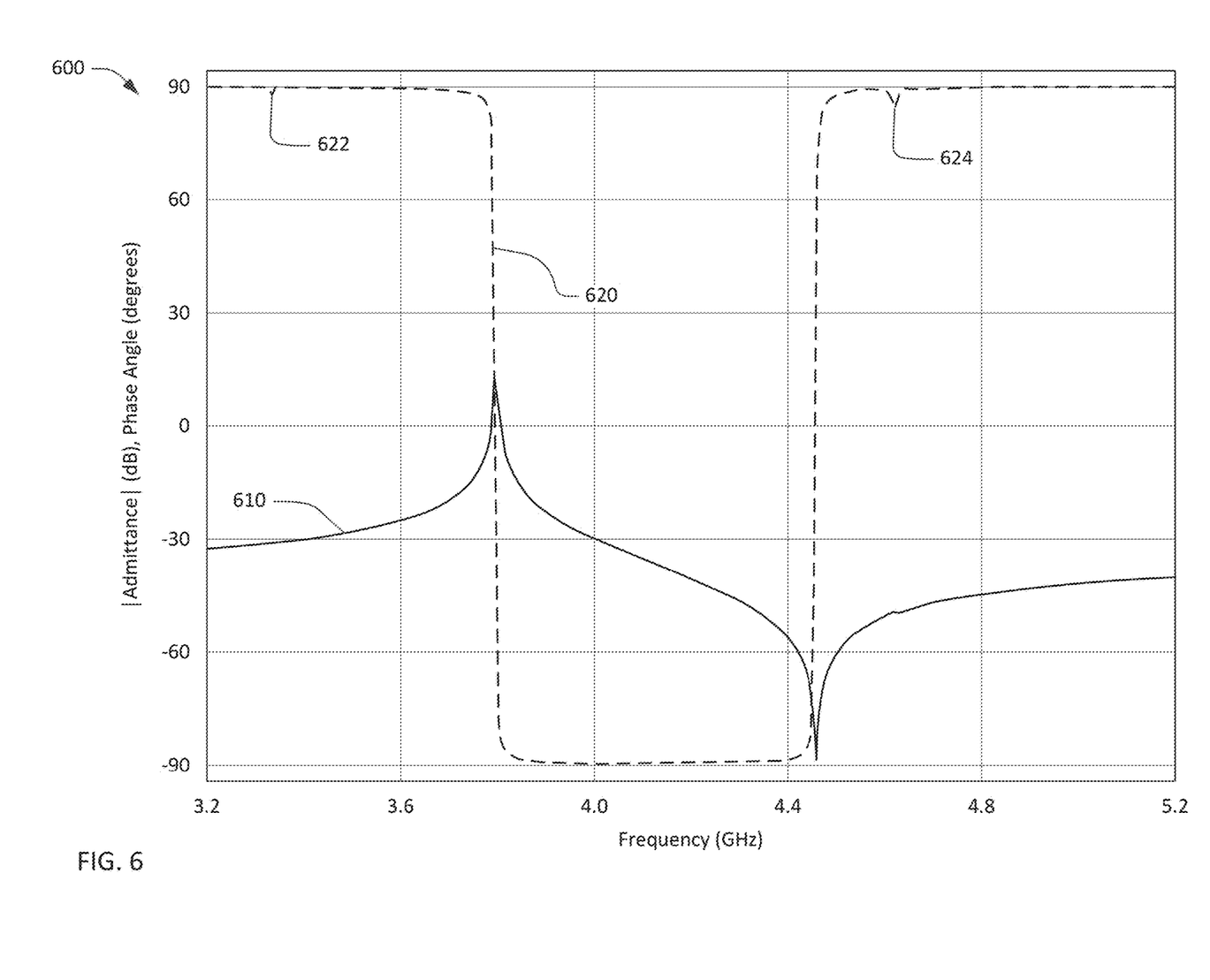
FIG. 6 is a graph of the admittance of a representative XBAR with a symmetric diaphragm as shown in FIG. 5.

FIG. 6 is a graph 600 of the admittance of an XBAR resonator with a symmetrical diaphragm similar to that shown in FIG. 5. The piezoelectric plate is rotated Y-X cut lithium niobate (Euler angles 0°, 38°, 0°) with a thickness of 500 nm. The IDT fingers and back-side fingers are aluminum 150 nm thick. The pitch of both the IDT fingers and back-side fingers is 3 microns and the mark/pitch ratio of both the IDT fingers and back-side fingers is 0.245. The data of FIG. 6 was determined by simulation of the XBAR performance using a finite element method, with the assumption that each back-side finger was electrically connected to the corresponding IDT finger.

Specifically, the solid line 610 is a plot of the magnitude of the admittance in dB as a function of frequency. The dashed line 620 is a plot of the phase angle of the admittance in degrees as a function of frequency. Phase angle is shown because phase angle is a more sensitive measure of spurious modes. Except for small perturbances in the phase angle at 622 and 624, the admittance of the XBAR is free from spurious modes over a 2 GHz frequency span.

Referring back to FIG. 5, the presence of the metal back-side fingers 556 provides several other advantages in addition to low excitation of spurious modes. First, the metal back-side fingers conduct heat away from the center of the diaphragm, improving the power handling capability of the XBAR. Second, when the back-side fingers are electrically connected to the corresponding IDT fingers, the capacitance per unit area of the XBAR is increased. This may allow the use of smaller resonators. Third, when the back-side fingers are electrically connected to the corresponding IDT fingers, the electric field in the piezoelectric plate is more uniform, which may result in higher electromechanical coupling. A useful measure of electromechanical coupling is RAR=2 $(F_{AR}-F_R)/(F_{AR}+F_R)$, where $F_R$ is the resonance frequency and $F_{AR}$ is the anti-resonance frequency of a resonator. In the example of FIG. 6, RAR is 16.2%.

Figure 7:
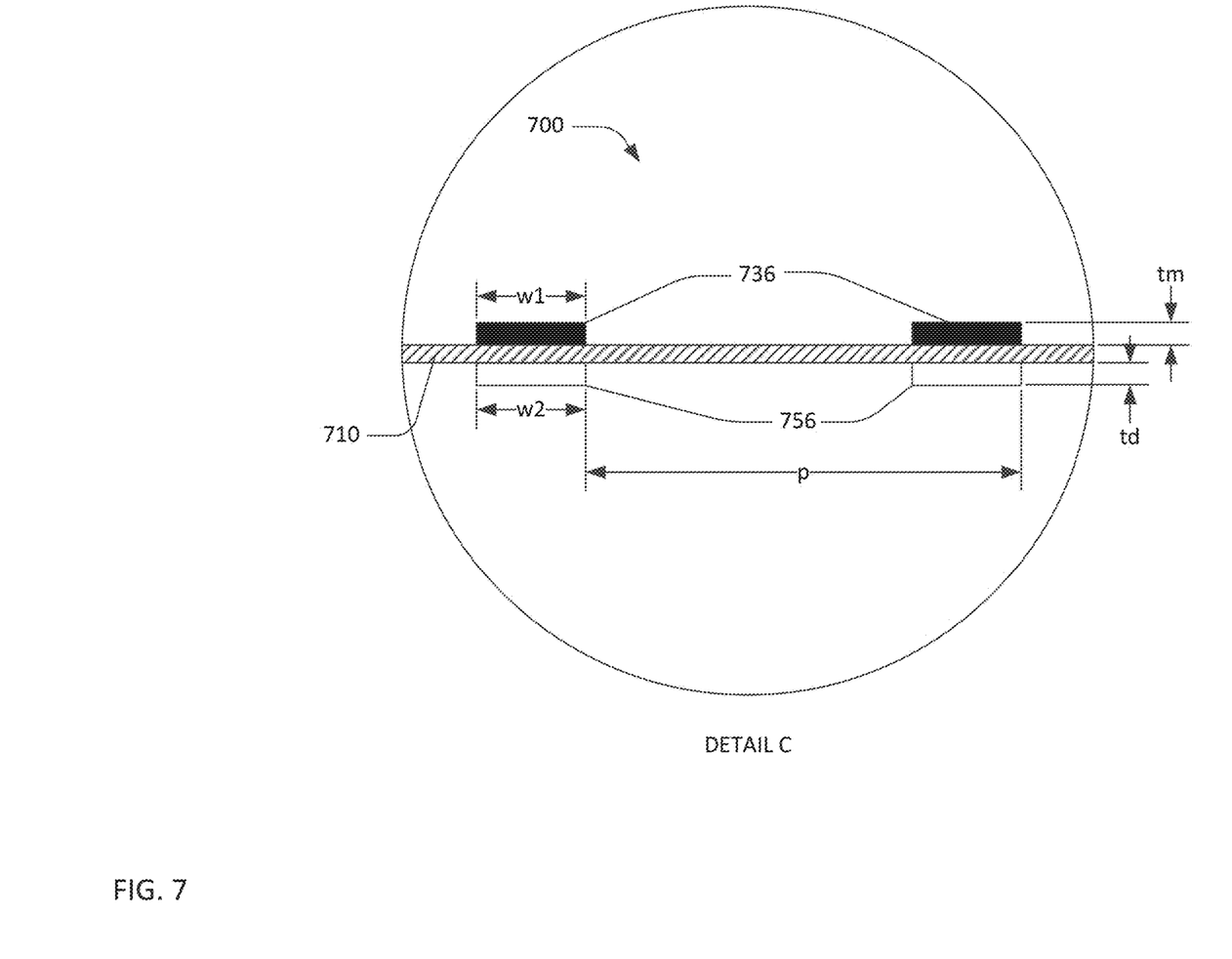
FIG. 7 is an expanded schematic cross-sectional view of a portion of the XBAR of FIG. 1 with a symmetrical diaphragm.

FIG. 7 shows an expanded schematic cross-sectional view of another XBAR 700 with a symmetric diaphragm in which IDT fingers 736 on the front surface of the piezoelectric plate 710 are balanced, to at least some extent, by back-side fingers 756 on the back surface of the piezoelectric plate.

The piezoelectric plate 710 is a single-crystal layer of piezoelectrical material. IDT fingers 736 are formed on the top surface of the piezoelectric plate as previously described. The IDT fingers may be composed of one or more layers of metals and may have some other cross-sectional shape, such as trapezoidal. Back-side fingers 756 are formed on the back surface of the piezoelectric plate 710. The back-side fingers 756 are a dielectric material and may have some other cross-sectional shape, such as trapezoidal. The back-side fingers 756 may be, for example, silicon dioxide, which has similar acoustic properties to aluminum. The back-side fingers may be, for further example, a high thermal conductivity dielectric material such as aluminum nitride, boron nitride, or diamond, which will improve heat removal from the diaphragm.

Each back-side finger 756 may be substantially aligned with a corresponding IDT finger 736. Each back-side finger 756 may extend across the aperture of the XBAR 700. The pitch p is the same for both the IDT fingers 736 and the back-side fingers 756. The width and thickness of the IDT fingers are the dimensions w1 and tm, respectively. The width and thickness of the back-side fingers are the dimensions w2 and td, respectively. When the IDT fingers 736 are aluminum and the back-side fingers 756 are silicon dioxide, w1 may be equal to w2 and tm1 may be equal to tm2. When one or both of the back-side fingers 756 and the IDT fingers 736 are other material, one or both of w2 and tm2 may be adjusted to minimize excitation of spurious modes.

Figure 8:
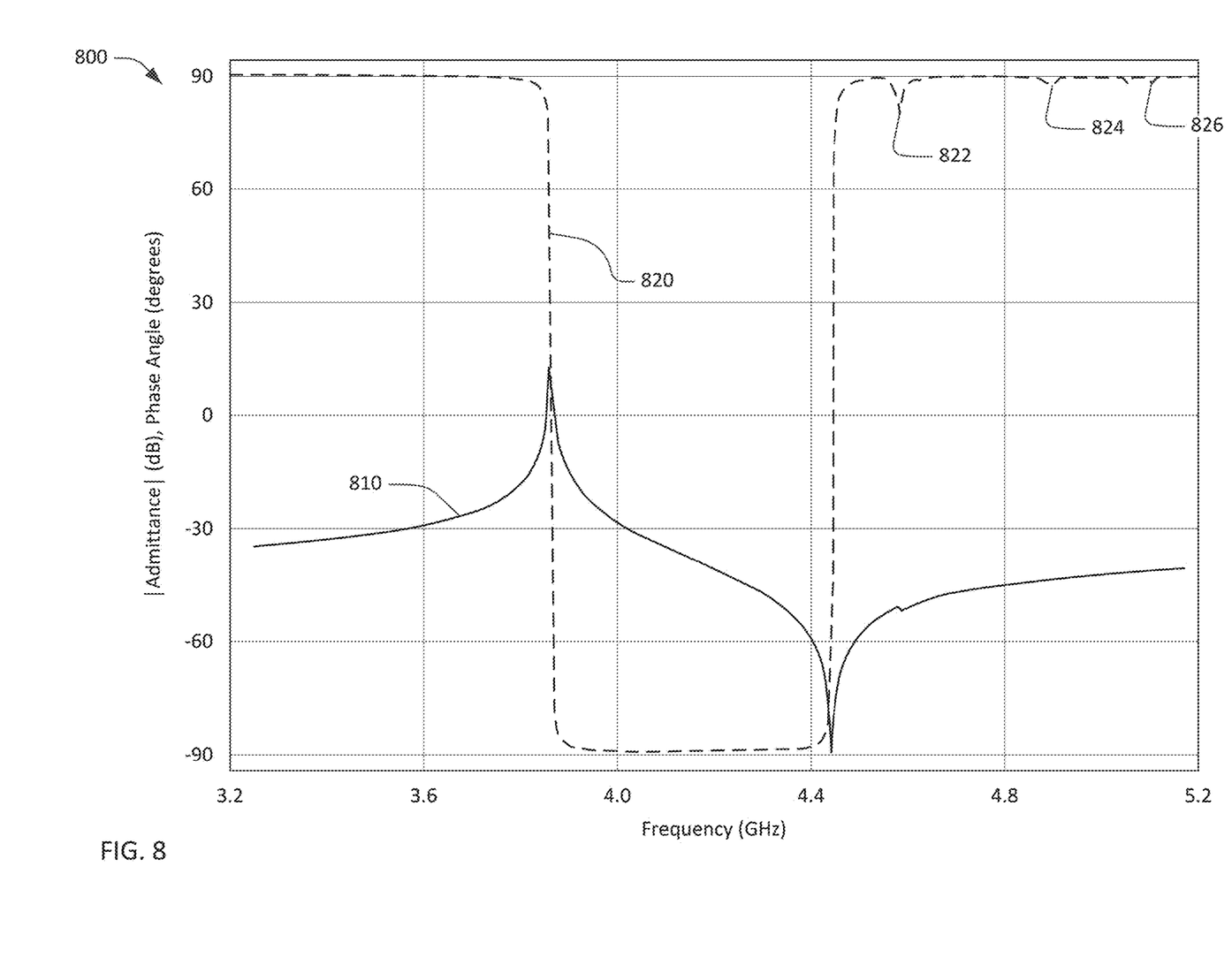
FIG. 8 is a graph of the admittance of a representative XBAR with a symmetric diaphragm as shown in FIG. 7.

FIG. 8 is a graph 800 of the admittance of an XBAR resonator with a symmetrical diaphragm similar to that shown in FIG. 7. The piezoelectric plate is rotated Y-X cut lithium niobate (Euler angles 0°, 38°, 0°) with a thickness of 500 nm. The IDT fingers are aluminum 150 nm thick. The back-side fingers are silicon dioxide 170 nm thick. The pitch of both the IDT fingers and back-side fingers is 3 microns and the mark/pitch ratio of both the IDT fingers and back-side fingers is 0.25. The data of FIG. 8 was determined by simulation of the XBAR performance using a finite element method, with the assumption that each back-side finger was electrically connected to the corresponding IDT finger.

Specifically, the solid line 810 is a plot of the magnitude of the admittance in dB as a function of frequency. The dashed line 820 is a plot of the phase angle of the admittance in degrees as a function of frequency. Spurious modes can be seen as small perturbances in the phase angle at 822, 824, 826. The spurious modes are slightly stronger and more numerous that the previous example. RAR for this example is 13.9%.

Figure 9:
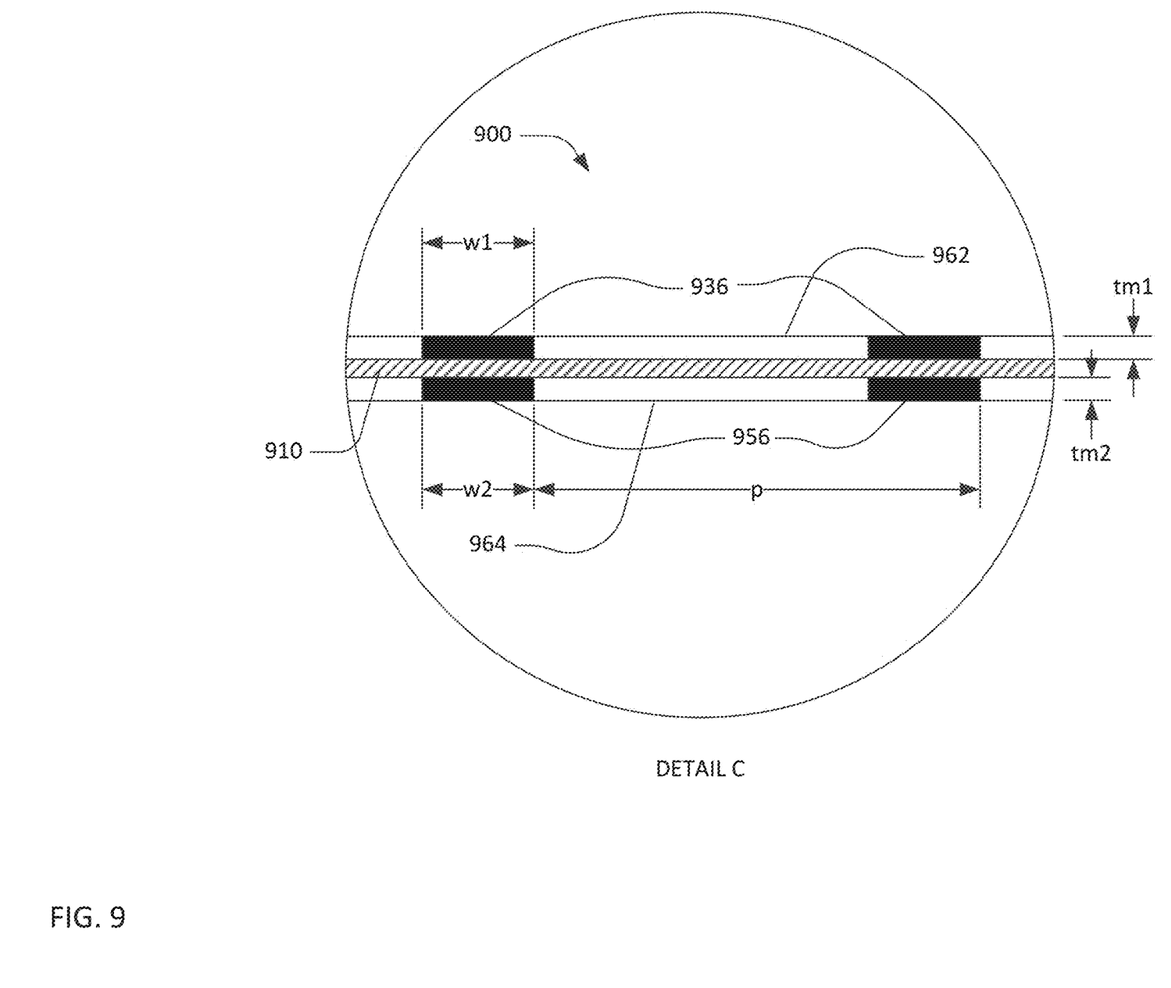
FIG. 9 is an expanded schematic cross-sectional view of a portion of the XBAR of FIG. 1 with a symmetrical diaphragm.

FIG. 9 shows an expanded schematic cross-sectional view of another XBAR 900 with a symmetric diaphragm in which IDT fingers 936 on the front surface of the piezoelectric plate 910 are balanced, to at least some extent, by back-side fingers 956 on the back surface of the piezoelectric plate.

The piezoelectric plate 910 is a single-crystal layer of piezoelectrical material. IDT fingers 936 are formed on the top surface of the piezoelectric plate as previously described. The IDT fingers may be composed of one or more layers of metals and may have some other cross-sectional shape, such as trapezoidal. The back-side fingers 956 may also be composed of one or more layers of metals and may have some other cross-sectional shape, such as trapezoidal. The composition and cross-sectional shape of the back-side fingers 956 may be the same or different from the composition and cross-sectional shape of the IDT fingers 936.

Each back-side finger 956 may be substantially aligned with a corresponding IDT finger 936. Each backside finger 956 may extend across the aperture of the XBAR 900. The back-side fingers 956 may connect alternately to back-side busbars to form an IDT on the back surface of the piezoelectric plate. The back-side busbars may be electrically connected to the busbars of the IDT (130 in FIG. 1) on the front surface of the piezoelectric plate. In this case, each back-side finger 956 is electrically connected to the corresponding IDT finger 936.

A frontside dielectric layer 962 is formed on the front surface of the piezoelectric plate 910 and a backside dielectric layer 964 is formed on the back side of the piezoelectric plate 910. As shown in FIG. 9, the thickness of the front-side dielectric layer 962 is the same as the thickness tm1 of the IDT fingers 936 such that the IDT fingers 936 are embedded in the front-side dielectric layer 962. Similarly, the thickness of the back-side dielectric layer 964 is the same as the thickness tm2 of the back-side fingers 956 such that the back-side fingers 956 are embedded in the back-side dielectric layer 964. This is not necessarily the case, and one or both of the dielectric layers may be thinner or thicker than the associated fingers.

Preferably, the acoustic impedance of the material of the front-side dielectric layer 962 and the acoustic impedance of the IDT fingers 936 are similar or equal to minimize the impedance mismatch between the dielectric material and the finger. Similarly, the acoustic impedance of the material of the back-side dielectric layer 964 and the acoustic impedance of the back-side fingers 956 are similar or equal. Minimizing the impedance mismatch between the fingers and the associated dielectric layers reduces reflections of traveling acoustic waves from the fingers, which may attenuate or eliminate some spurious acoustic modes. For example, when the IDT or back-side fingers are aluminum, the adjacent dielectric layer may be silicon dioxide. When the IDT or back-side fingers are copper, the adjacent dielectric layer may be tantalum pentoxide ($Ta_2O_5$). Other dielectric material may be use with other finger materials.

Figure 10:
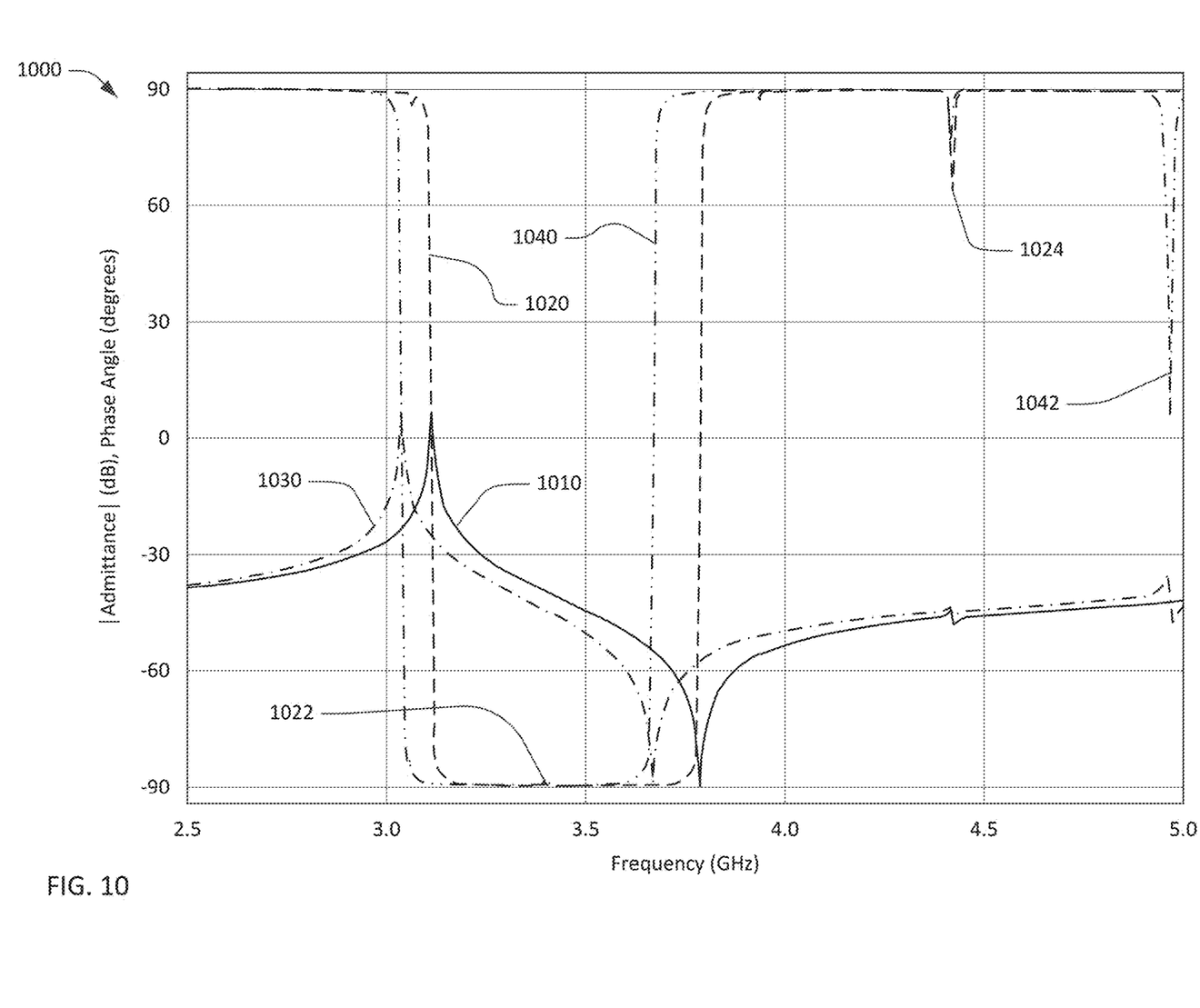
FIG. 10 is a graph of the admittance of a representative XBAR with a symmetric diaphragm as shown in FIG. 9.

FIG. 10 is a graph 1000 of the admittance of an XBAR resonator with a symmetrical diaphragm similar to that shown in FIG. 9. The piezoelectric plate is rotated Y-X cut lithium niobate (Euler angles 0°, 38°, 0°) with a thickness of 500 nm. The IDT fingers and back-side fingers are aluminum 145 nm thick. The front-side and back-side dielectric layers are silicon dioxide 145 nm thick. The pitch of both the IDT fingers and back-side fingers is 4.5 microns and the mark/pitch ratio of both the IDT fingers and back-side fingers is 0.24. The data of FIG. 10 was determined by simulation of the XBAR performance using a finite element method, with the assumption that each back-side finger was electrically connected to the corresponding IDT finger.

Specifically, the solid line 1010 is a plot of the magnitude of the admittance of a first resonator in dB as a function of frequency. The dashed line 1020 is a plot of the phase angle of the admittance of the first resonator in degrees as a function of frequency. Spurious modes can be seen as a small perturbance in the phase angle at 1022, and a substantial deviation of the phase angle at 1024. Both of these modes are harmonics of the S0 plate mode. RAR for this example is 19.3%.

The dot-dash line 1030 is a plot of the magnitude of the admittance of a second resonator in dB as a function of frequency. The second resonator is the same as the first resonator with an additional 20 nm of SiO2 over the front-side dielectric layer and the IDT fingers. The dot-dot-dash line 1040 is a plot of the phase angle of the admittance of the second resonator in degrees as a function of frequency. The additional dielectric layer lowers the resonance frequency of the second resonator by about 80 MHz relative to the resonance frequency of the fist resonator. The spurious modes of the second resonator are similar to those of the first resonator except for the addition of a substantial spur at 1042.

Description of Methods

Figure 11:
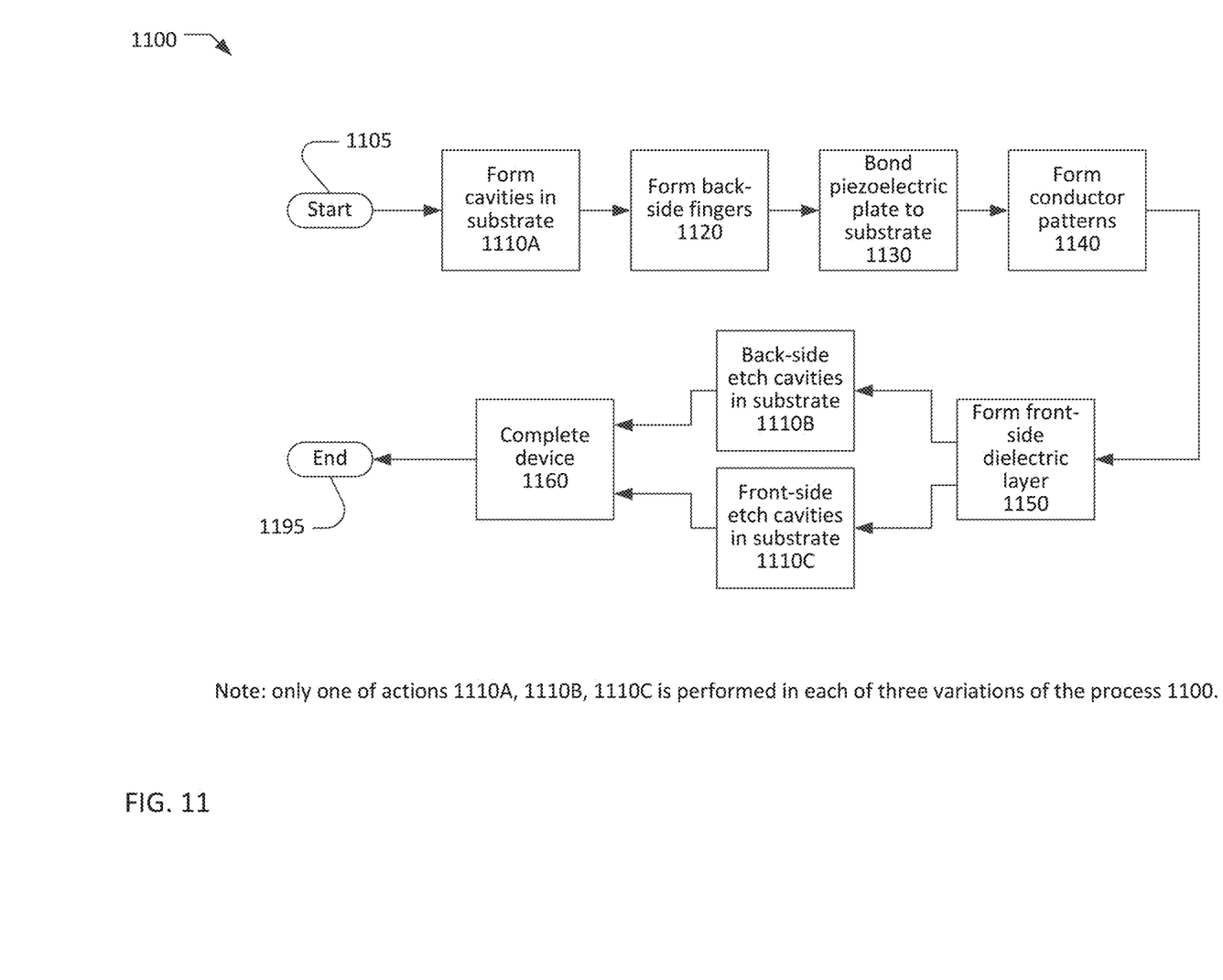
FIG. 11 is a flow chart of a process for fabricating an acoustic resonator filter without frequency-setting dielectric layers.

FIG. 11 is a simplified flow chart showing a process 1100 for making an XBAR or a filter incorporating XBARs with symmetric diaphragms. The process 1100 starts at 1105 with a substrate and a plate of piezoelectric material and ends at 1195 with a completed XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The flow chart of FIG. 11 captures three variations of the process 1100 for making an XBAR which differ in when and how cavities are formed in the substrate. The cavities may be formed at steps 1110A, 1110B, or 1110C. Only one of these steps is performed in each of the three variations of the process 1100.

The piezoelectric plate may be, for example, Z-cut, rotated Z-cut or rotated Y-cut lithium niobate as used in the previously presented examples. The piezoelectric plate may be some other material and/or some other cut. The substrate may preferably be silicon. The substrate may be some other material that allows formation of deep cavities by etching or other processing.

In one variation of the process 1100, one or more cavities are formed in the substrate at 1110A before the piezoelectric plate is bonded to the substrate at 1130. A separate cavity may be formed for each resonator in a filter device. The one or more cavities may be formed using conventional photolithographic and etching techniques. Typically, the cavities formed at 1110A will not penetrate through the substrate, and the resulting resonator devices will have a cross-section as shown in FIG. 2.

At 1120, back-side fingers may be formed on the surface (which will become the back surface) of the piezoelectric plate that will be subsequently bonded to the substrate. The back-side fingers may be formed by depositing and patterning the metal or dielectric material of the back-side fingers using conventional techniques. Optionally, a backside dielectric layer, such as the back-side dielectric layer 964 in FIG. 9, may be formed between metal back-side fingers.

When cavities in the substrate were formed at 1110A and the back-side fingers fall completely within the cavities, the process 1105 may proceed to 1130 where the piezoelectric plate will be bonded to the substrate. In other situations, the surface of the piezoelectric plate is planarized before bonding. The surface of the piezoelectric plate may be planarized by first burying the back-side fingers in a sacrificial material and planarizing the surface of the sacrificial material using, for example, chemo-mechanical polishing or some other process. When the back-side fingers are metal, the sacrificial material may be a dielectric such as silicon dioxide or phosphosilicate glass (PSG). When the back-side fingers are dielectric, or when a dielectric is disposed between metal back-side fingers, the sacrificial material may be a different dielectric that can be removed by etching without altering the back-side fingers. After the surface of the piezoelectric plate is planarized, the process 1100 may proceed to 1130 where the piezoelectric plate is bonded to the substrate.

The piezoelectric plate and the substrate may be bonded at 1130 using a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1140 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT busbars and interconnections between the IDTs).

The conductor pattern may be formed at 1140 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1140 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

Optionally, one or more front-side dielectric layers may be formed at 1150 over the IDTs of some or all of the resonators in a filter device. The front-die dielectric layer(s) may be deposited and patterned using conventional techniques.

In a second variation of the process 1100, one or more cavities are formed in the back side of the substrate at 1110B. A separate cavity may be formed for each resonator in a filter device. The one or more cavities may be formed using an anisotropic or orientation-dependent dry or wet etch to open holes through the back side of the substrate to the piezoelectric plate. Forming the cavities at 1110B also includes removing the sacrificial material from the back side of the piezoelectric plate to expose the back-side fingers. In this case, the resulting resonator devices will have a cross-section as shown in FIG. 1.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device. Forming the cavities at 1110C also includes removing the sacrificial material from the back side of the piezoelectric plate to expose the back-side fingers. The one or more cavities formed at 1110C will not penetrate through the substrate, and the resulting resonator devices will have a cross-section as shown in FIG. 2.

In all variations of the process 1100, the filter device is completed at 1160. Actions that may occur at 1160 include depositing a passivation and tuning layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Any dielectric layer deposited at 1160 or elsewhere in the process 1100 is deposited over all resonators. Another action that may occur at 1160 is to tune the resonant frequencies of the resonators within the device by adding or removing metal or dielectric material from the front side of the device. After the filter device is completed, the process ends at 1195.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
a substrate having a surface;
a single-crystal piezoelectric plate having front and back surfaces, the back surface attached to the surface of the substrate except for a portion of the piezoelectric plate forming a diaphragm spanning a cavity in the substrate;
an interdigital transducer (IDT) formed on the front surface of the piezoelectric plate, interleaved IDT fingers of the IDT disposed on the diaphragm; and
back-side fingers formed on the back surface of the diaphragm, a pitch of the IDT fingers and a pitch of the back-side fingers are substantially equal.

2. The device of claim 1, wherein
each back-side finger is aligned with a corresponding one of the IDT fingers.

3. The device of claim 1, wherein a mass per unit length of each back-side finger is effectively equal to a mass per unit length of the corresponding IDT finger.

4. The device of claim 1, wherein
an aperture of the acoustic resonator device is defined by the overlapping portions of the IDT fingers, and
each back-side finger extends across the aperture.

5. The device of claim 1 wherein the back-side fingers are conductors.

6. The device of claim 5, wherein the back-side fingers connect alternately to first and second back-side busbars to form a back-side IDT.

7. The device of claim 6, wherein the back-side IDT is electrically connected to the IDT formed on the front surface of the piezoelectric plate such that each back-side finger is electrically connected to the corresponding IDT finger.

8. The device of claim 5, wherein the IDT fingers and the back-side fingers have the same structure and substantially equal width and thickness.

9. The device of claim 5, further comprising:
a front-side dielectric layer formed between the IDT fingers; and
a back-side dielectric layer formed between the back-side fingers.

10. The device of claim 9, wherein
the IDT fingers and back-side fingers are substantially aluminum, and
the front-side dielectric layer and the back-side dielectric layer are silicon dioxide.

11. The device of claim 9, wherein
the IDT fingers and back-side fingers are substantially copper, and
the front-side dielectric layer and the back-side dielectric layer are tantalum pentoxide.

12. The device of claim 1, wherein the back-side fingers are dielectric.

13. The device of claim 12, wherein
the IDT fingers are substantially aluminum, and
the back-side fingers are silicon dioxide.

14. The device of claim 12, wherein
the IDT fingers are substantially copper, and
the back-side fingers are tantalum pentoxide.

15. The device of claim 12, wherein
a thickness of the IDT fingers and a thickness of the back-side fingers are substantially equal, and
a width of the IDT fingers and a width of the back-side fingers are substantially equal.

16. A filter device comprising:
a substrate having a surface;
a single-crystal piezoelectric plate having front and back surfaces, the back surface attached to the surface of the substrate except for portions of the piezoelectric plate forming a plurality of diaphragms spanning respective cavities in the substrate;
a conductor pattern including a plurality of interdigital transducers (IDT) of a corresponding plurality of acoustic resonators formed on the front surface of the piezoelectric plate, interleaved IDT fingers of each IDT disposed on a respective diaphragm from the plurality of diaphragms; and
back-side fingers formed on the back surface of one or more diaphragms from the plurality of diaphragms,
wherein, for each diaphragm having back-side fingers, a pitch of the back-side fingers is substantially equal to the pitch of the IDT fingers on the front surface of the diaphragm.

17. The device of claim 16, wherein
each back-side finger is aligned with a corresponding one of the IDT fingers.

18. The device of claim 17, wherein a mass per unit length of each back-side finger is effectively equal to a mass per unit length of the corresponding IDT finger.

19. The device of claim 16 wherein the back-side fingers are conductors.

20. The device of claim 19, further comprising for each diaphragm having back-side fingers:
a front-side dielectric layer formed between the IDT fingers; and
a back-side dielectric layer formed between the back-side fingers.

21. The device of claim 16, wherein the back-side fingers are dielectric.

* * * * *